United States Patent
Sun et al.

(10) Patent No.: US 11,886,082 B2
(45) Date of Patent: Jan. 30, 2024

(54) LIQUID CRYSTAL DISPLAY PANEL, LIQUID CRYSTAL DISPLAY DEVICE AND DETECTION METHOD THEREOF

(71) Applicant: HKC CORPORATION LIMITED, Guangdong (CN)

(72) Inventors: Xiaowu Sun, Shenzhen (CN); Wei Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/940,360

(22) Filed: Sep. 8, 2022

(65) Prior Publication Data
US 2023/0099964 A1    Mar. 30, 2023

(30) Foreign Application Priority Data
Sep. 26, 2021    (CN) ........................... 202111126787.2

(51) Int. Cl.
*G02F 1/1345* (2006.01)
*G02F 1/1362* (2006.01)
(Continued)

(52) U.S. Cl.
CPC ....... *G02F 1/13458* (2013.01); *G01R 19/155* (2013.01); *G02F 1/133388* (2021.01);
(Continued)

(58) Field of Classification Search
None
See application file for complete search history.

(56) References Cited

U.S. PATENT DOCUMENTS 5,790,212 A * 8/1998 Lim ...................... G02F 1/1362
349/149
2009/0231534 A1* 9/2009 Morita .................. G02F 1/1339
349/153
(Continued)

FOREIGN PATENT DOCUMENTS

CN    106597705 A    4/2017
CN    112230480 A    1/2021
(Continued)

*Primary Examiner* — Ryan Crockett
(74) *Attorney, Agent, or Firm* — Maier & Maier, PLLC

(57) ABSTRACT

The liquid crystal display panel includes a color filter substrate providing with a common electrode layer t; and an array substrate arranged in cell alignment with the color filter substrate and providing with a common electrode line, the array substrate includes a display area and a peripheral area including a plurality of connection areas located on the connection areas and arranged between the color filter substrate and the array substrate; at least one connection area includes a conductive sub-region and a detection sub-region, and the conductive members located on the conductive sub-region are respectively in contact with the common electrode line and the common electrode layer for conducting the common electrode line and the common electrode layer; and the conductive members located on the detection sub-region are respectively in contact with the common electrode layer and a detection pad for conducting the common electrode layer and the detection pad.

17 Claims, 7 Drawing Sheets

(51) Int. Cl.
  *G02F 1/1333* (2006.01)
  *G01R 19/155* (2006.01)
  *G02F 1/1335* (2006.01)
  *G02F 1/1343* (2006.01)

(52) U.S. Cl.
  CPC .. *G02F 1/133514* (2013.01); *G02F 1/134309* (2013.01); *G02F 1/136254* (2021.01); *G02F 1/133345* (2013.01)

(56) References Cited

U.S. PATENT DOCUMENTS

| | | | | |
|---|---|---|---|---|
| 2011/0090445 | A1* | 4/2011 | Kim | G02F 1/1339 349/139 |
| 2015/0131041 | A1* | 5/2015 | Moriwaki | G02F 1/1337 349/123 |
| 2015/0301370 | A1* | 10/2015 | Moriwaki | G02F 1/1339 349/42 |
| 2016/0018706 | A1* | 1/2016 | Niwano | G02F 1/136204 349/58 |
| 2018/0210245 | A1* | 7/2018 | Yao | C09J 11/04 |

FOREIGN PATENT DOCUMENTS

| | | | |
|---|---|---|---|
| JP | 2006292846 A | * | 10/2006 |
| JP | 2006292846 A | | 10/2006 |
| JP | 2012185422 A | | 9/2012 |

* cited by examiner

LIQUID CRYSTAL DISPLAY PANEL, LIQUID CRYSTAL DISPLAY DEVICE AND DETECTION METHOD THEREOF

CROSS REFERENCE TO RELATED APPLICATION

The present application claims priority of Chinese Patent Application, with Application No. 202111126787.2, filed on Sep. 26, 2021, titled "a liquid crystal display panel, a liquid crystal display device and a detection method thereof", submitted to CNIPA, the content of which is incorporated herein by reference.

TECHNICAL FIELD

The present application relates to the technical field of display, and more particularly to a liquid crystal display panel, a liquid crystal display device and a detection method thereof.

BACKGROUND

In the prior art, the method of applying an external voltage to the liquid crystal is as follows: dotting gold balls on the array substrate through a manner of dotting, communicating the array substrate with the color filter substrate through the gold balls, and the current is conducted to the color filter substrate through the gold balls, However, in the actual process, due to the poor alignment between the color filter substrate and the array substrate, or the alignment film is easy to diffuse to positions of the gold balls before curing, which results in the display abnormal problems of poor conductivity of the gold balls, resulting in abnormal gamma, crosstalk etc. In order to solve the above problems, a liquid crystal display panel that can easily detect the conduction effect is needed.

SUMMARY

An embodiment of the present application provides a liquid crystal display panel, a liquid crystal display device and a detection method thereof, parts of conductive members are used to connect an external detection pad, so as to detect whether the common electrode line of the array substrate and the common electrode layer of the color filter substrate are normally conductive.

In order to achieve above object, the technical solution adopted in the present application are:

According to a first aspect of the present application, a liquid crystal display panel is provided, which includes:
- a color filter substrate, provided with a common electrode layer thereon; and
- an array substrate, arranged in cell alignment with the color filter substrate, and provided with a common electrode line thereon, the array substrate includes a display area and a peripheral area, the peripheral area including a plurality of connection areas; and a plurality of conductive members located on the connection areas and arranged between the color filter substrate and the array substrate;
- at least one connection area includes a conductive sub-region and a detection sub-region, and the conductive members located on the conductive sub-region are respectively in contact with the common electrode line and the common electrode layer, and configured for conducting the common electrode line and the common electrode layer; and the conductive members located on the detection sub-region are respectively in contact with the common electrode layer and a detection pad, and configured for conducting the common electrode layer and the detection pad; and the detection pad is arranged on the array substrate.

The embodiment of the present application provides a liquid crystal display panel. By arranging the conductive members between the array substrate and the color filter substrate, parts of the conductive members is used to conduct the common electrode line on the array substrate and the common electrode layer on the color filter substrate, and another parts of the conductive members conduct the common electrode layer on the color filter substrate and the detection pad. Based on this, it can be determined whether the common electrode line on the array substrate and the common electrode layer on the color filter substrate are normally conducted by detecting whether there is a voltage on the detection pad.

In an implementation of the first aspect, an insulating layer is further laid on the array substrate, and the insulating layer is located between the common electrode line and the detection pad.

In an implementation of the first aspect, along a thickness direction of the liquid crystal display panel, the detection pad is located on a side of a target conductive member away from the color filter substrate, and the detection pad is in the same layer with the common electrode line, and the target conductive member is configured for indicating the conductive members located on the detection sub-region.

In an implementation of the first aspect, a material of the detection pad is the same as a material of the common electrode line.

In an implementation of the first aspect, a size of the color filter substrate is smaller than a size of the array substrate, and a part of the detection pad is located on an area where the color filter substrate and the array substrate are not overlapped, and the area being close to a circuit board.

In an implementation of the first aspect, a shape of the detection sub-region is one selected from a group of a circle, a square, a triangle, and a polygon.

In an implementation of the first aspect, the conductive sub-region and the detection sub-region are adjacent to each other and have complementary shapes.

In an implementation of the first aspect, the conductive members are gold balls or silver balls.

According to a second aspect of the present application, a liquid crystal display device is provided, which includes the liquid crystal display panel in the first aspect and any one the implementations in the first aspect, the liquid crystal display panel further includes a liquid crystal layer disposed between the color filter substrate and the array substrate.

According to a third aspect of the present application, a detection method for liquid crystal display panel is provided, connecting a detection device to the detection pad in the liquid crystal display panel in the first aspect and any one the implementations in the first aspect, and determining whether a voltage is detected on the detection pad through the detection device; when the voltage is detected from the detection device, the common electrode layer on the color filter substrate and the common electrode line on the array substrate are in normal conduction; and when no voltage is detected from the detection device, the common electrode layer on the color filter substrate and the common electrode line on the array substrate are not conducted.

The benefit effects of the second aspect and the third aspect are referring to the content in the first aspect, which is not repeated herein.

DETAILED DESCRIPTION OF EMBODIMENTS

Figures 1, 2:
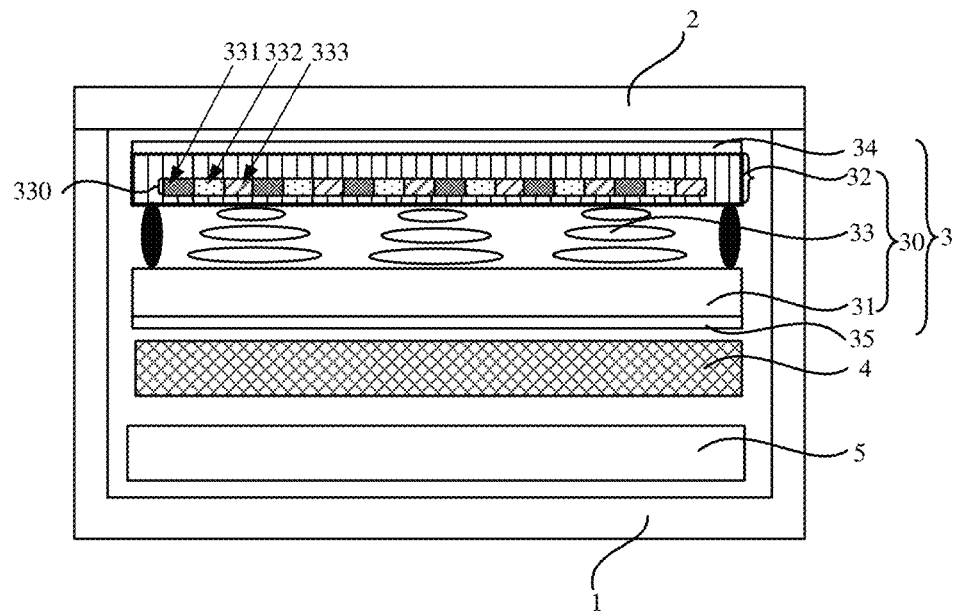
FIG. 1 is a schematic cross-sectional view of a liquid crystal display device provided in a first embodiment of the present application.
FIG. 2 is a schematic top view of a liquid crystal display panel according to a second embodiment of the present application.

In order to make the purpose, technical solutions and advantages of the present application more clearly understood, the present application will be described in further detail below with reference to the accompanying drawings and embodiments. It should be understood that the specific embodiments described herein are only used to explain the present application, but not to limit the present application.

Unless otherwise defined, technical or scientific terms used in the present application shall have the ordinary meaning as understood by those skilled in the art. The terms "first", "second" and similar terms used in the description and claims of the present application do not denote any order, quantity or importance, but are only used to distinguish different components. Thus, features defined as "first" and "second" may expressly or implicitly include one or more of such features. In the description of the embodiments of the present application, unless otherwise specified, "a plurality of" means two or more.

Orientation terms such as "left", "right", "upper" and "lower" are defined relative to the orientation in which the display components are schematically placed in the drawings, and it should be understood that these directional terms are relative concepts, and they are used for the description and clarification of the relative, which may change correspondingly according to the change of the orientation of the array substrate or the display device.

First Embodiment

In the embodiments of the present application, taking the liquid crystal display device is a backlight type liquid crystal display device as an example. FIG. 1 shows a schematic structural view of a backlight type liquid crystal display device provided by an embodiment of the present application.

As shown in FIG. 1, the main structure of the liquid crystal display device includes: a frame 1, a cover plate 2, a liquid crystal display module 3, a backlight module 4, a circuit board 5 and other electronic accessories including a camera. The liquid crystal display module 3 includes a liquid crystal display panel 30, an upper polarized layer 34 disposed on a side of the liquid crystal display panel 30 close to the cover plate 2, and a lower polarized layer 35 disposed on a side of the liquid crystal display panel 30 close to the backlight module. The liquid crystal display panel 30 includes an array substrate 31, an opposite substrate, and a liquid crystal layer 33 disposed between the array substrate 31 and the opposite substrate. The array substrate 31 and the opposite substrate are in cell alignment together by a sealant. Thereby the liquid crystal layer 33 is defined in the area surrounded by the sealant. The color filter layer 330 is usually disposed on the opposite substrate, and the opposite substrate is referred to as the color filter substrate 32.

It should be understood that the color filter layer 330 is used to filter the white light emitted from the array substrate 31 into light of different colors. The color filter layer 330 generally includes three primary color resist units arranged in an array. For example, the three primary color resist units include a red color resist layer 331, a green color resist layer 332 and a blue color resist layer 333. The red color resist layer 331 can filter the white light emitted from the array substrate 31 into red light, the green color resist layer 332 can filter the white light emitted from the array substrate 31 into green light, and the blue color resist layer 333 can filter the white light emitted from the array substrate 31 into blue light. In other embodiments, the color filter layer 330 can also include other color resist units, and the embodiment of the present application uses three primary color resist units as an example for description.

As shown in FIG. 1, taking the U-shaped longitudinal section of the frame 1 as an example, the liquid crystal display module 3, the backlight module 4, the circuit board 5 and other electronic accessories including cameras are arranged in the frame 1, and the backlight module 4 is arranged below the liquid crystal display module 3, the circuit board 5 is located between the backlight module 4 and the frame 1, and the cover plate 2 is located at the side of the liquid crystal display module 3 away from the backlight module 4. The cover plate 2 may be, for example, a transparent glass.

It should be understood that the display principle of the liquid crystal display device in FIG. 1 is as follows: the backlight module 4 emits white light, the white light passes through the lower polarized layer 35 to form white polarized light with a specific polarization direction, then the white polarized light enters the array substrate 31 and then is adjusted by the liquid crystal layer 33, and then the polarized light of red, green and blue is formed by filtering through the color filter layer 330 on the color filter substrate 32. When the polarization direction of the three primary color polarized light is perpendicular to the polarization direction of the upper polarized layer 34, the three primary color polarized light cannot pass through the upper polarized layer 34, and no light emits at this time; when the polarization direction of the three primary color polarized light is parallel to the polarization direction of the upper polarized layer 34, the three primary color polarized light can pass through the upper polarized layer 34, and the light intensity of the emitted light is the strongest at this time. It should be understood that since the liquid crystal molecules have optical rotatory properties to polarized light, the polarization direction of the polarized light passing through the liquid crystal layer 33 can change by the specific arrangement direction of the liquid crystal molecules, when the arrangement direction of the liquid crystal molecules is rotated under the control of the electric field applied by the pixel electrode and the common electrode, the polarized light of the three primary colors will regularly transmit or not transmit through the upper polarized layer 34, and finally a color image is formed.

Based on the liquid crystal display device shown in FIG. 1, in FIG. 1, the propagation sequence of the light path is as follows: the backlight module 4 emits light and passes through the lower polarized layer 35, the array substrate 31, the liquid crystal layer 33, the color filter substrate 32, and the upper polarized layer 34 in sequence, and then emitting out the cover plate 2.

In the above liquid crystal display device, for the TN and VA modes, the common electrode layer 322 (not shown in FIG. 1) is provided on the color filter substrate 32, and the pixel electrode layer 313 (not shown in FIG. 1) is provided on the array substrate 31. The common electrode signal on the common electrode layer 322 in the color filter substrate 32 needs to be transferred from the array substrate 31. Therefore, gold balls are arranged between the array substrate 31 and the color filter substrate 32, so that the common electrode line 312 on the array substrate 31 can transmit the common electrode signal received from the circuit board 5 to the common electrode layer 322 on the opposite color filter substrate 32 through the gold balls.

In order to save cost, the practice in the related art is to dot the gold balls on the array substrate 31 at the corresponding positions connected to the common electrode layer 322 by means of dotting. However, due to the current development of display products in the direction of narrow borders, the area of the gold balls on the array substrate 31 is very small, and the alignment film coated on the array substrate 31 is fluid before curing, which is very likely to spread to the gold balls to cover the gold balls, and the alignment film is insulating after curing. Therefore, the gold balls need to pierce the alignment film to conduct the pixel electrode layer 313 of the array substrate 31 and the common electrode layer 322 of the color filter substrate 32. In this way, the conductivity is very poor or cannot be conducted, and then there are abnormal display problems such as gamma abnormality and crosstalk, etc.

In view of this, the embodiment of the present application provides a liquid crystal display panel. By arranging the conductive members between the array substrate and the color filter substrate, parts of the conductive members is used to conduct the common electrode line on the array substrate and the common electrode layer on the color filter substrate, and another parts of the conductive members conduct the common electrode layer on the color filter substrate and the detection pad. Based on this, it can be determined whether the common electrode line on the array substrate and the common electrode layer on the color filter substrate are normally conducted by detecting whether there is a voltage on the detection pad.

Second Embodiment

Figure 3:
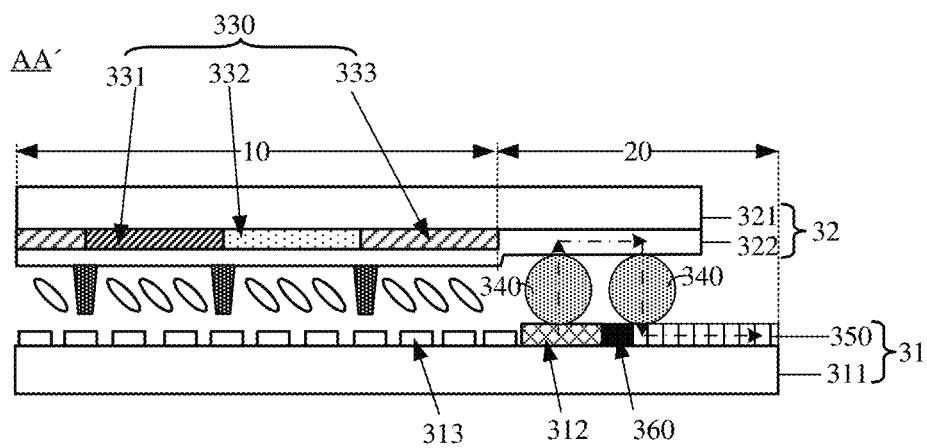
FIG. 3 is a schematic cross-sectional view of a liquid crystal display panel provided in a second embodiment of the present application.
Figure 4:
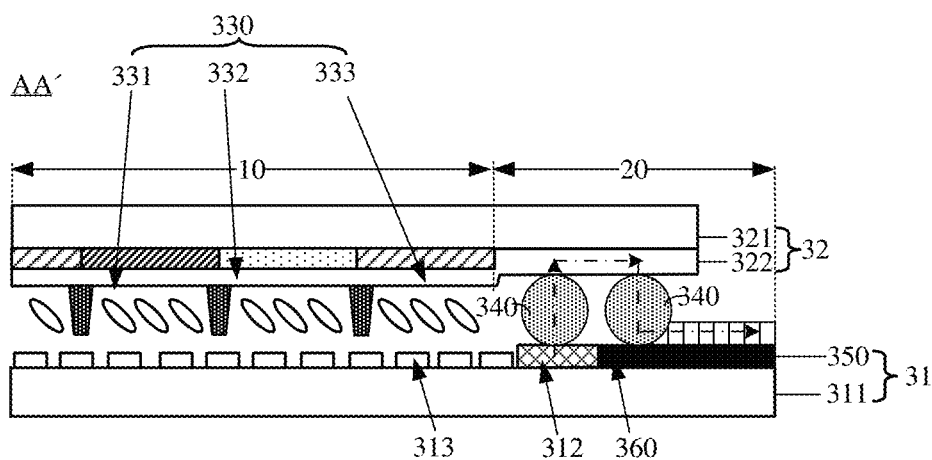
FIG. 4 is a schematic cross-sectional view of another liquid crystal display panel provided in a second embodiment of the present application.

The liquid crystal display panel 30 provided by the embodiments of the present application will be described in detail below with reference to the accompanying drawings. FIG. 2 shows a schematic structural view of a liquid crystal display panel 30 provided by an embodiment of the present application. FIG. 3 shows a schematic cross-sectional view along the AA' direction in FIG. 2. FIG. 4 shows another schematic cross-sectional view along the AA' direction in FIG. 2.

As shown in FIGS. 2 to 4, an embodiment of the present application provides a liquid crystal display panel 30, including: a color filter substrate 32 and an array substrate 31 arranged in a cell alignment, and a common electrode layer 322 is provided on the color filter substrate 32 (not shown in FIG. 2), and a common electrode line 312 (not shown in FIG. 2) is provided on the array substrate 31.

As shown in FIG. 2, the liquid crystal display panel 30 further includes a display area 10 and a peripheral area 20, and the peripheral area 20 includes a plurality of connection areas 21. At least one connection area 21 includes a conductive sub-region 211 and a detection sub-region 212. The conductive members 340 located on the conductive sub-region 211 are in contact with the common electrode line 312 and the common electrode layer 322, respectively, and used for conducting the common electrode line 312 and the common electrode layer 322.

The conductive members 340 located on the detection sub-region 212 are respectively in contact with the common electrode layer 322 and a detection pad 350, and configured for conducting the common electrode layer 322 and the detection pad 350; and the detection pad 350 is arranged on the array substrate 31, and located on the peripheral area 20.

It should be understood that the display area 10 is used for image display, and the peripheral area 20 is used for other functions such as wiring, and is not used for image display.

It should be understood that the peripheral area 20 is located on at least one side around the display area 10, or the peripheral area 20 may also be disposed around the display area 10. For example, when the shape of the display area 10 is a rectangle, the peripheral area 20 refers to an area surrounding the four sides of the display area 10. The widths of the areas surrounding the display area 10 may be the same or different, which is not limited in the embodiment of the present application.

It should be understood that the peripheral area 20 includes a plurality of connection areas 21, and the number, distribution, shape and size of the connection areas 21 can be set and modified as required, which is not limited in the embodiment of the present application. Exemplarily, in the peripheral area 20 of the array substrate 31, the plurality of connection areas 21 are arranged at intervals.

In addition, for the arrangement of the conductive sub-region 211 and the detection sub-region 212, each connection area 21 can include the conductive sub-region 211 and the detection sub-region 212, or parts of the connection areas 21 include the conductive sub-region 211, parts of the connection areas 21 include the detection sub-region 212, and each connection area 21 in the remaining connection areas 21 includes both the conductive sub-region 211 and the detection sub-region 212.

The number, separation, shape, and size of the conductive sub-region(s) 211 and the detection sub-region(s) 212 can be arranged and modified as required, which is not limited in the embodiment of the present application.

It should be understood that, a plurality of conductive members 340 are arranged between the color filter substrate 32 and the array substrate 31 and located on the connection areas 21, and it can also be understood that the plurality of conductive members 340 are arranged in the conductive sub-region 211 and the detection sub-region 212. In this way, parts of the conductive members 340 are located on the conductive sub-region 211, and parts of the conductive members 340 are located on the detection sub-region 212.

It should be understood that, as shown in FIGS. 1 to 4, the liquid crystal display panel 30 includes the color filter substrate 32 and the array substrate 31 arranged in a cell alignment, the common electrode layer 322 on the color filter substrate 32 is usually all laid on one side of the first base substrate 321 close to the array substrate 31. In addition, a color filter layer 330 is usually laid between the first base substrate 321 and the common electrode layer 322. The common electrode line 312 provided on the array substrate 31 is laid on the side of the second base substrate 311 close to the color filter substrate 32, and the common electrode line 312 is usually located on the peripheral area 20 on the array substrate 31, and the external port of the common electrode line 312 is connected to the circuit board 5. The circuit board 5 is used to provide the array substrate 31 with various signals required by the liquid crystal display panel 30, and the signals include the signals required by the color filter substrate 32.

On this basis, the common electrode signal required by the common electrode layer 322 provided on the color filter substrate 32 can be obtained from the circuit board 5 through the common electrode line 312 on the array substrate 31, and then the common electrode line 312 on the array substrate 31 is transmitted to the common electrode layer 322 of the color filter substrate 32 through the conductive members 340 located on the conductive sub-region 211. Thus, the transmission of the common electrode signal from the circuit board, the common electrode line 312 on the array substrate 31 and the conductive member s340 located on the conductive sub-region 211 to the common electrode layer 322 on the color filter substrate 32 is realized.

The conductive members 340 of the conductive sub-regions 211 can be connected to the common electrode line 312 on the array substrate 31 through via transferring holes. Herein, the plurality of conductive members 340 of the conductive sub-regions 211 can be connected to the same common electrode line 312 on the array substrate 31 through corresponding transferring holes. Based on this, the conductive members 340 located on the conductive sub-region 211 are in contact with the common electrode layer 322 on the color filter substrate 32, so that the common electrode line 312 and the common electrode layer 322 can be conducted, and the common electrode signals on the common electrode line 312 can be transmitted to the common electrode layer 322 of the color filter substrate 32.

It should be understood that when the detection pad 350 is disposed on the array substrate 31, the conductive members 340 located on the detection sub-region 212 are in contact with the common electrode layer 322 and the detection pad 350 on the color filter substrate 32, and are used to conduct the common electrode layer 322 and the detection pad 350. Therefore, when a voltage is detected from the detection pad 350 by a detection device (such as a voltmeter or a multimeter), the voltage means that signals are generated on the common electrode layer 322 on the color filter substrate 32. Thus, the common electrode signal can be transmitted from the circuit board, the common electrode line 312 on the array substrate 31, and the conductive member 340 located on the conductive sub-region 211 to the common electrode layer 322 on the color filter substrate 32, and further indicates that the conductive members 340 located on the conductive sub-region 211 is normally conducted, so that the common electrode layer 322 on the color filter substrate 32 can have signals. Herein, the detection pad 350 can be in contact with the conductive members 340 located on the detection sub-region 212, indicating that the detection pad 350 is located on the detection sub-region 212, that is, in the peripheral area 20.

When no voltage is detected from the detection pad 350, that is no signal on the common electrode layer 322, therefore the common electrode signals cannot be transmitted from the circuit board, the common electrode line 312 on the array substrate 31, and the conductive member 340 located on the conductive sub-region 211 to the common electrode layer 322 on the color filter substrate 32. Based on the normal connection of the common electrode line 312 on the circuit board and the array substrate 31, the conductive members 340 located on the conductive sub-region 211 is normally contacted to the common electrode layer on the color filter substrate 32. Then, the conductive members 340 located on the conductive sub-region 211 are abnormally connected to the common electrode line 312 on the array substrate 31, and thus the signals cannot be transmitted.

In an embodiment, as a possible implementation manner, the conductive members 340 are gold balls or silver balls.

The embodiment of the present application provides a liquid crystal display panel. By arranging the conductive members between the array substrate and the color filter substrate, parts of the conductive members is used to conduct the common electrode line on the array substrate and the common electrode layer on the color filter substrate, and another parts of the conductive members conduct the common electrode layer on the color filter substrate and the detection pad. Based on this, it can be determined whether the common electrode line on the array substrate and the common electrode layer on the color filter substrate are normally conducted by detecting whether there is a voltage on the detection pad.

In an embodiment, as a possible implementation manner, an insulating layer 360 is further laid on the array substrate 31, and the insulating layer 360 is located between the common electrode line 312 and the detection pad 350. The insulating layer 360 is used to isolate the voltage on the common electrode line and the detection pad 350.

It should be understood that the detection pad 350 is used to detect whether the conductive members 340 located on the conductive sub-region 211 conduct the common electrode line 312 and the common electrode layer 322. Therefore, on the array substrate 31, the detection pad 350 and the common electrode line 312 cannot be in contact with each other. In this way, t can be detected whether the common electrode signals on the circuit board 5 are really transmitted to the common electrode layer 322 on the color filter substrate 32.

Based on this, when the common electrode line 312 and the detection pad 350 are located on the same layer, the insulating layer 360 can be provided between the common electrode line 312 and the detection pad 350, and the insulating layer 360 is provided on the same layer as the common electrode line 312 and the detection pad 350. When the common electrode line 312 and the detection pad 350 are not in the same layer, the insulating layer 360 can be arranged around the common electrode line 312 along the thickness direction of the liquid crystal display panel 30 and located the side of the detection pad 350 close to the array substrate 31.

The material of the insulating layer 360 can be arranged as required, which is not limited in the embodiment of the present application.

In an embodiment, as a possible implementation manner, as shown in FIG. 3, along the thickness direction of the liquid crystal display panel 30, the target conductive members of the detection pad 350 are located on the side away from the color filter substrate 32 and are on the same layer as the common electrode line 312. The target conductive members are used to indicate the conductive members 340 located on the detection sub-region 212.

It should be understood that when the detection pad 350 is located at the side of the target conductive members away from the color filter substrate 32, that is, the detection pad 350 is located at the side of the target conductive members close to the array substrate 31. Therefore, the detection pad 350 can be arranged on the array substrate 31 firstly, and then the conductive members 340 are arranged on the detection sub-region 212, the process is simple.

The conductive members 340 located on the conductive sub-region 211 is sandwiched between the common electrode layer 322 and the common electrode line 312, that is, the common electrode line 312 is located at the side of the conductive members 340 of the conductive sub-region 211 away from the color filter substrate 32, based on this, the detection pad 350 in the same layer as the common electrode line 312 can be prepared in the same layer as the common electrode line 312, and the conductive members 340 located on the conductive sub-region 211 and the conductive members 340 located on the detection sub-region 212 can be prepared at the same time. The process is convenient and quick.

In an embodiment, as a possible implementation manner, the material of the detection pad 350 is the same as the material of the common electrode line 312.

In an embodiment, as a possible implementation manner, the size of the color filter substrate 32 is smaller than the size of the array substrate 31, and a part of the detection pad 350 is located on an area where the color filter substrate 32 and the array substrate 31 are not overlapped, and the area is close to the circuit board.

As shown in FIG. 2, the color filter substrate 32 and the array substrate 31 are usually aligned at the center. In this way, when the size of the color filter substrate 32 is smaller than the size of the array substrate 31, taking the array substrate 31 and the color filter substrate 32 being rectangles as an example, in one side of the peripheral area 20 close to the circuit board 5, the array substrate 31 and the color filter substrate 32 are usually not completely overlapped.

When the part of the detection pad 350 is located on the area that is not overlapped, the side close to the color filter substrate 32 is not blocked, which is convenient for subsequent detection of the detection pad 350 by other devices. The wider the area that is not overlapped, the larger the exposed area of the detection pad 350, and the device for subsequent detection can fully contact the exposed area of the detection pad 350 in the area that is not overlapped, and the detection is more accurate.

In an embodiment, as a possible implementation manner, the shape of the detection sub-region 212 is one selected from a group of a circle, a square, a triangle, and a polygon.

FIGS. 5 to 8 respectively show a schematic diagram of a connection area 21 provided by an embodiment of the present application.

Figure 5:
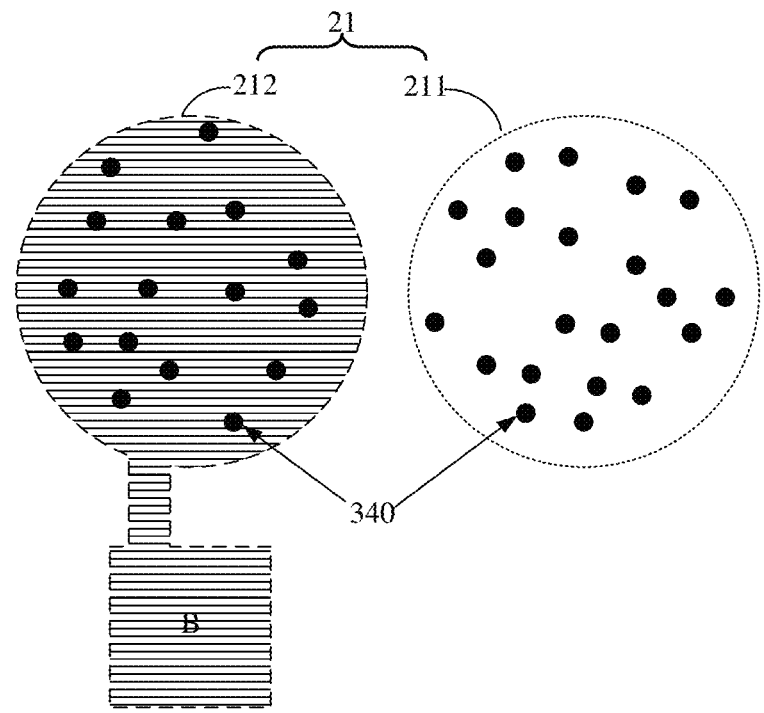
FIG. 5 is a schematic diagram of one of four connection areas provided in a second embodiment of the present application.

As shown in FIG. 5, when the shape of the detection sub-region 212 is a circle, the corresponding detection pad 350 located on the detection sub-region 212 is a circle with a same size, so as to be in sufficient contact with the conductive members 340 of the detection sub-region 212. In addition, in order to facilitate subsequent detection, the detection pad 350 can also extend a part from the detection sub-region 212, and the part is located on the area where the array substrate 31 and the color filter substrate 32 are not overlapped.

Based on this, in order to facilitate subsequent detection, the extended part of the detection pad 350 cab increase in area, such as a square, exemplarily, as shown in area B in FIG. 5, thus, the voltmeter can be in sufficient contact with the detection pad 350 during subsequent detection.

Figure 6:
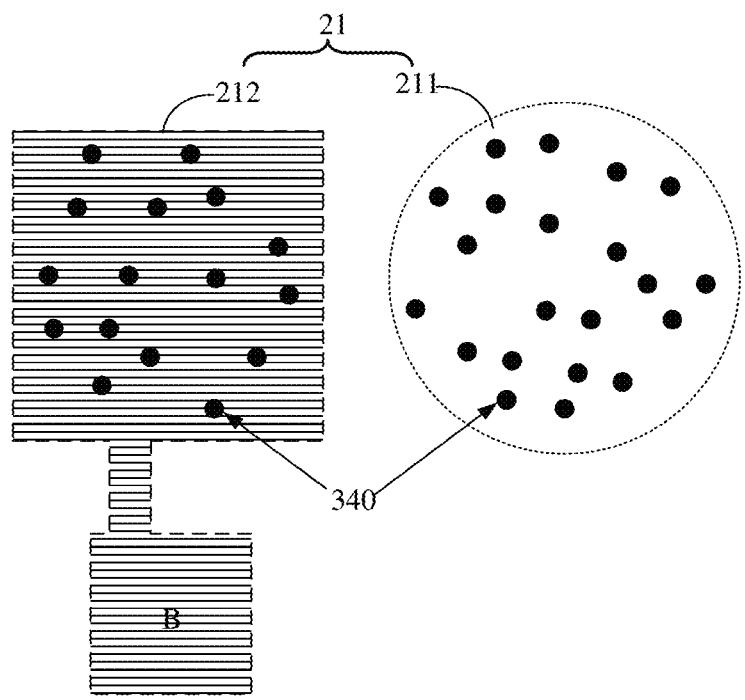
FIG. 6 is a schematic diagram of one of four connection areas provided in a second embodiment of the present application.
Figure 7:
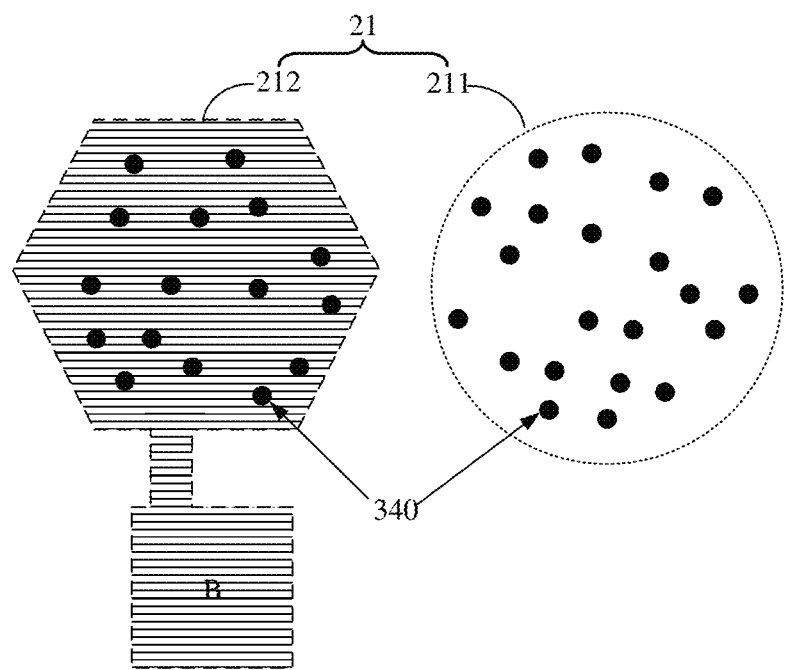
FIG. 7 is a schematic diagram of one of four connection areas provided in a second embodiment of the present application.
Figure 8:
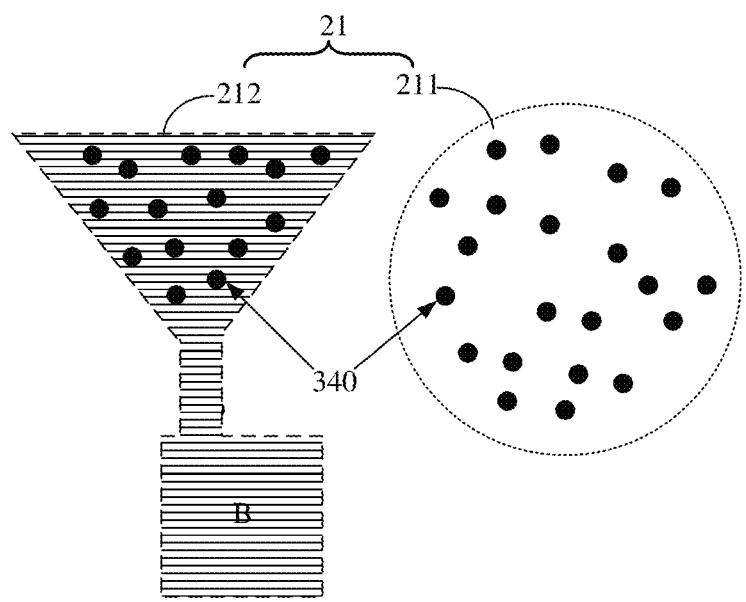
FIG. 8 is a schematic diagram of one of four connection areas provided in a second embodiment of the present application.

Similarly, as shown in FIG. 6, the shape of the detection sub-region 212 can be a square, and the corresponding detection pad 350 located on the detection sub-region 212 is square with a same size. Alternatively, as shown in FIG. 7, the shape of the detection sub-region 212 can be a hexagon, and the corresponding detection pad 350 located on the detection sub-region 212 is hexagonal with a same size. Alternatively, as shown in FIG. 8, the shape of the detection sub-region 212 can be a triangle, and the corresponding detection pad 350 located on the detection sub-region 212 is triangle with a same size. In other embodiments, the detection sub-region 212 can also be in other shapes, and the above are just examples, which are not limited in the embodiment of the present application.

In an embodiment, the conductive sub-region 211 and the detection sub-region 212 are adjacent to each other and have complementary shapes.

FIGS. 9 to 14 show schematic diagrams of other six connection areas 21 provided by the embodiments of the present application.

Figure 9:
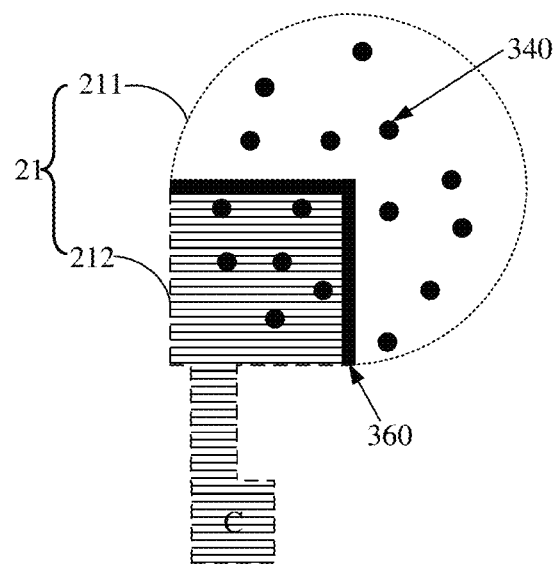
FIG. 9 is a schematic diagram of another one of six connection areas provided in a second embodiment of the present application.

As shown in FIG. 9, the conductive sub-region 211 is a sector of 270 degree, and the detection sub-region 212 is a square, and the side length of the square is equal to the radius of the sector. Therefore, a missing sector of 90 degree at lower left portion of the conductive sub-region 211 is supplemented by the detection sub-region 212.

Figure 10:
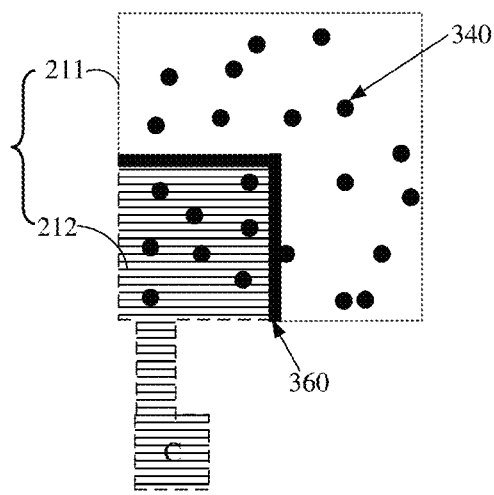
FIG. 10 is a schematic diagram of another one of six connection areas provided in a second embodiment of the present application.

As shown in FIG. 10, the conductive sub-region 211 is a polygon, the detection sub-region 212 is a square, and the two side lengths of the conductive sub-region 211 are the same as the side lengths of the detection sub-region 212. Therefore, when the conductive sub-region 211 is adjacent to the detection sub-regions 212, a large square can be formed.

Figure 11:
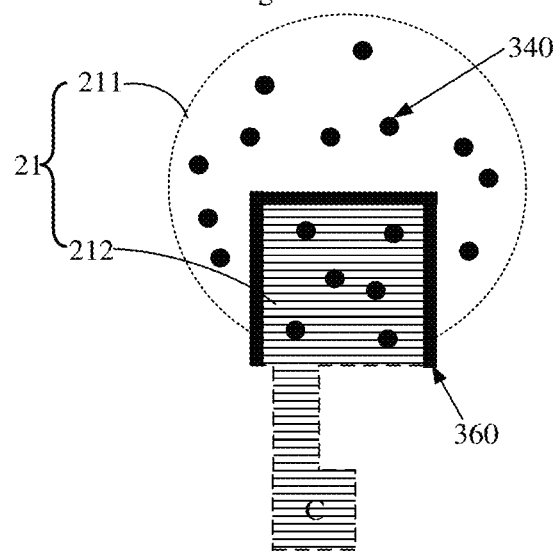
FIG. 11 is a schematic diagram of another one of six connection areas provided in a second embodiment of the present application.

As shown in FIG. 11, the detection sub-region 212 is a square, and the conductive sub-region 211 is a partial circle adjacent to the three sides of the square.

Figure 12:
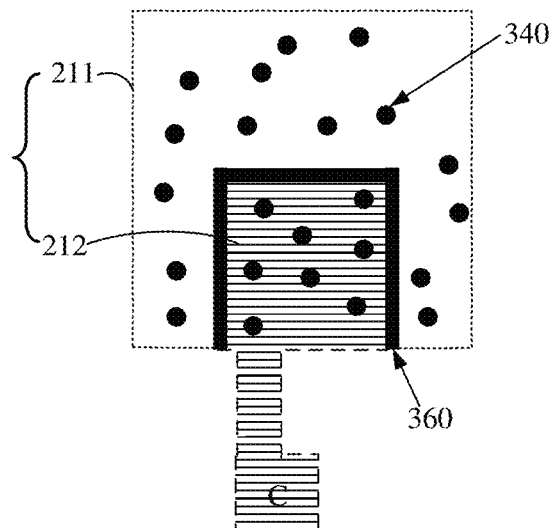
FIG. 12 is a schematic diagram of another one of six connection areas provided in a second embodiment of the present application.

As shown in FIG. 12, the detection sub-region 212 is a square, and the conductive sub-region 211 is a partial square adjacent to three sides of the square. When the conductive sub-region 211 is adjacent to the detection sub-regions 212, a large square can be formed.

Figure 13:
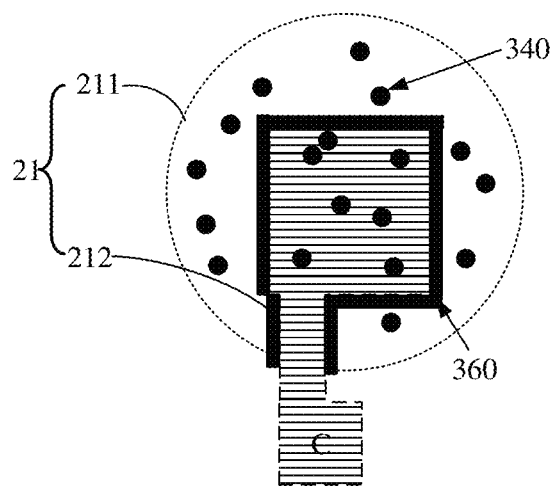
FIG. 13 is a schematic diagram of another one of six connection areas provided in a second embodiment of the present application.

As shown in FIG. 13, the detection sub-region 212 is a square, and the conductive sub-region 211 is a circle-shaped region surrounding the square. When the conductive sub-region 211 is adjacent to the detection sub-regions 212, a complete circle can be formed.

Figure 14:
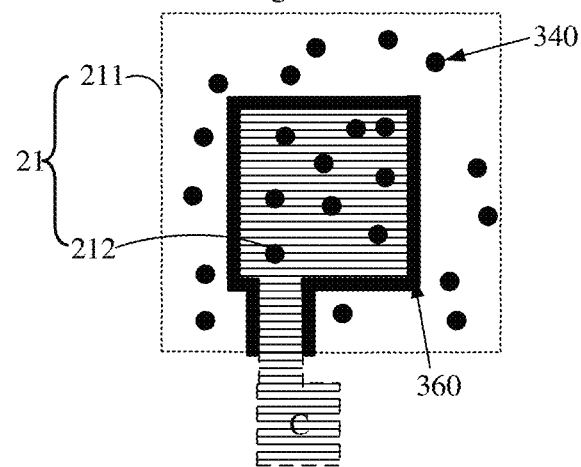
FIG. 14 is a schematic diagram of another one of six connection areas provided in a second embodiment of the present application.

As shown in FIG. 14, the detection sub-region 212 is a square, and the conductive sub-region 211 is a square-shaped region surrounding the square. When the conductive sub-region 211 is adjacent to the detection sub-regions 212, a complete large square can be formed.

As shown in FIGS. 9 to 14, when the conductive sub-region 211 and the detection sub-region 212 are adjacent and have complementary shapes, the conductive members 340 located on the conductive sub-region 211 and the conductive members 340 in the detection sub-region 212 can be prepared at the same time, the occupied area is relatively small, which can be beneficial to the narrow frame design of the display panel to a certain extent.

It should also be understood that, in order to avoid contact between the common electrode line 312 and the detection pad 350, the insulating layer 360 can also be formed between the conductive sub-region 211 and the detection sub-region 212 to prevent the common electrode line 312 from being conductive with the detection pad 350.

Embodiments of the present application further provide a liquid crystal display device, including the liquid crystal display panel 30 described above.

In the liquid crystal display device provided by the embodiments of the present application, by arranging the conductive members between the array substrate and the color filter substrate, parts of the conductive members is used to conduct the common electrode line on the array substrate and the common electrode layer on the color filter substrate, and another parts of the conductive members conduct the common electrode layer on the color filter substrate and the detection pad. Based on this, it can be determined whether the common electrode line on the array substrate and the common electrode layer on the color filter substrate are normally conducted by detecting whether there is a voltage on the detection pad.

Third Embodiment

Figure 15:
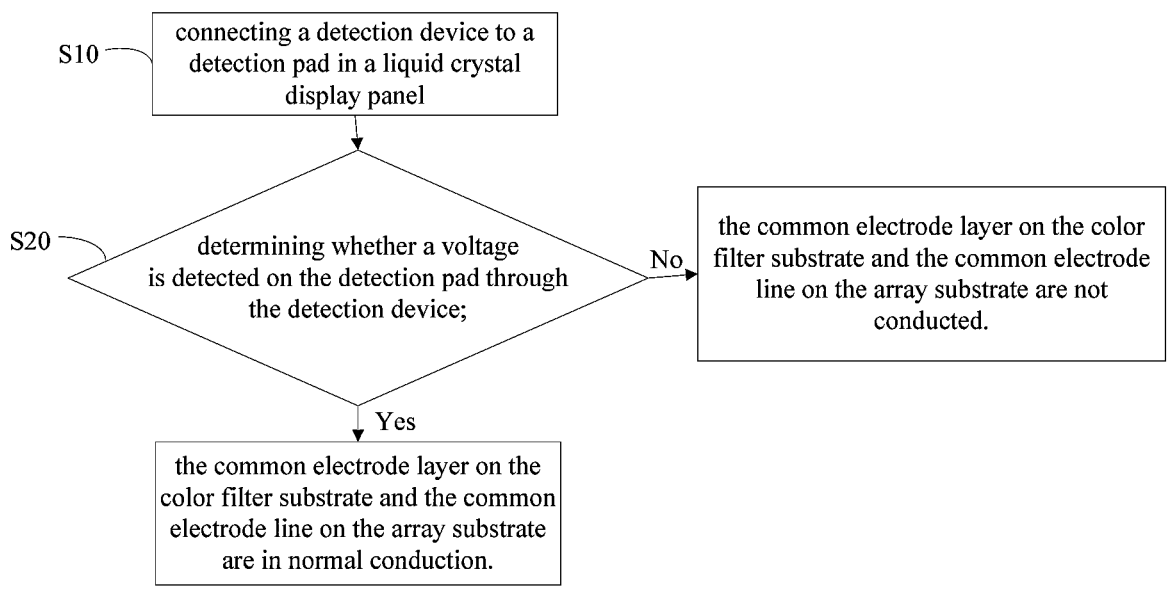
FIG. 15 is a flowchart of a liquid crystal display panel detection method provided in a third embodiment of the present application.

The embodiment of the present application further provides a detection method, as shown in FIG. 15, the detection method includes the following steps S10 to S20.

S10, connecting a detection device to a detection pad in a liquid crystal display panel 30 described above. The detection device can be a device that can detect voltage, such as a voltmeter, a multimeter, etc., which is not limited in the embodiment of the present application.

S20, determining whether a voltage is detected on the detection pad through the detection device;

when the voltage is detected from the detection device, the common electrode layer 322 on the color filter substrate 32 and the common electrode line 312 on the array substrate 31 are in normal conduction; and when no voltage is detected from the detection device, the common electrode layer 322 on the color filter substrate 32 and the common electrode line 312 on the array substrate 31 are not conducted.

When the voltage is detected from the detection device, and if the detection voltage is lower than a preset voltage, then some other problems are existed, for example, the PI liquid partially covers the conductive sub-region 211, or the common electrode layer 322 on the color filter substrate 32 is not conducted to the common electrode line 312 on the array substrate 31, while a certain capacitance is existed between the common electrode layers 322 on the color filter substrate 32 and the conductive member 340 located on the detection sub-region 212.

It should be understood that during the detection of the liquid crystal display panel 30 provided by the present application, if the voltage can be detected through the detection pad 350, the conductive among the common electrode layer 322 on the color filter substrate 32, the conductive members 340 located on the detection sub-region 212, and the detection pad 350 is well.

Based on this, if the detection voltage is greater than the preset voltage, then in the liquid crystal display panel 30, the common electrode line 312 on the array substrate 31 transmits the common electrode signals to the common electrode layer 322 the color filter substrate 32 through the conductive members 340 located on the conductive sub-region 211, and the conductive is well. Therefore, a conduction loop among the common electrode lines 312 on the array substrate 31, the conductive members 340 on the detection sub-region 212, the common electrode layer 322 on the color filter substrate 32, the conductive members 340 on the detection sub-region 212, and the detection pad 350 can be formed, such that the voltage can be detected in the subsequent detection.

If the detection voltage is less than the preset voltage, then in the liquid crystal display panel 30, the common electrode line 312 on the array substrate 31 transmits the common electrode signals to the common electrode layer 322 the color filter substrate 32 through the conductive members 340 located on the conductive sub-region 211, and the conductive is poor. Therefore, although a conduction loop among the common electrode lines 312 on the array substrate 31, the conductive members 340 on the detection sub-region 212, the common electrode layer 322 on the color filter substrate 32, the conductive members 340 on the detection sub-region 212, and the detection pad 350 can be formed, the voltage detected in the subsequent detection is smaller.

It should also be understood that the detection pad 350 of the present application only needs to be connected to the conductive members 340 located on the detection sub-region 212, which is a separate conduction path, and does not affect the operation of the array substrate 31 and the color filter substrate 32.

The beneficial effects of the detection method provided by the embodiments of the present application are the same as the beneficial effects of the liquid crystal display panel 30 described above, and which are not repeated here.

The above-mentioned embodiments are only used to illustrate the technical solutions of the present application, but not to limit the present application; those skilled in the art can easily think of changes or substitutions within the technical scope disclosed in the present application, and should be covered within the scope of protection of the present application. Therefore, the protection scope of the present application should be subject to the protection scope of the claims.

What is claimed is:
1. A liquid crystal display panel, comprising:
   a color filter substrate provided with a common electrode layer thereon; and
   an array substrate arranged in cell alignment with the color filter substrate, and provided with a common electrode line thereon, wherein the array substrate comprises a display area and a peripheral area, the peripheral area comprising a plurality of connection areas; and a plurality of conductive members located on the connection areas and arranged between the color filter substrate and the array substrate;

wherein at least one connection area comprises a conductive sub-region and a detection sub-region, and the conductive members located on the conductive sub-region are respectively in contact with the common electrode line and the common electrode layer, and configured for conducting the common electrode line and the common electrode layer; and the conductive members located on the detection sub-region are respectively in contact with the common electrode layer and a detection pad, configured for conducting the common electrode layer and the detection pad; and the detection pad is arranged on the array substrate, and the detection pad is not in contact with the common electrode line.

2. The liquid crystal display panel according to claim 1, wherein an insulating layer is further laid on the array substrate, and the insulating layer is located between the common electrode line and the detection pad.

3. The liquid crystal display panel according to claim 1, wherein along a thickness direction of the liquid crystal display panel, the detection pad is located on a side of a target conductive member away from the color filter substrate, and the detection pad is in the same layer with the common electrode line, and the target conductive member is configured for indicating the conductive members located on the detection sub-region.

4. The liquid crystal display panel according to claim 3, wherein a material of the detection pad is the same as a material of the common electrode line.

5. The liquid crystal display panel according to claim 4, wherein a size of the color filter substrate is smaller than a size of the array substrate, and a part of the detection pad is located on an area where the color filter substrate and the array substrate are not overlapped, and the area being close to a circuit board.

6. The liquid crystal display panel according to claim 5, wherein a shape of the detection sub-region is one selected from a group of a circle, a square, a triangle, and a polygon.

7. The liquid crystal display panel according to claim 6, wherein the conductive sub-region and the detection sub-region are adjacent to each other and have complementary shapes.

8. The liquid crystal display panel according to claim 7, wherein the conductive members are gold balls or silver balls.

9. A liquid crystal display device, comprising a liquid crystal display panel, the liquid crystal display panel, comprising:

a color filter substrate provided with a common electrode layer thereon; and an array substrate arranged in cell alignment with the color filter substrate, and provided with a common electrode line thereon, wherein the array substrate comprises a display area and a peripheral area, the peripheral area comprising a plurality of connection areas; and a plurality of conductive members located on the connection areas and arranged between the color filter substrate and the array substrate;

wherein at least one connection area comprises a conductive sub-region and a detection sub-region, and the conductive members located on the conductive sub-region are respectively in contact with the common electrode line and the common electrode layer, and configured for conducting the common electrode line and the common electrode layer; and the conductive members located on the detection sub-region are respectively in contact with the common electrode layer and a detection pad, and configured for conducting the common electrode layer and the detection pad; the detection pad is arranged on the array substrate, and the detection pad is not in contact with the common electrode line; and wherein the liquid crystal display panel further comprises a liquid crystal layer disposed between the color filter substrate and the array substrate.

10. The liquid crystal display device according to claim 9, wherein an insulating layer is further laid on the array substrate, and the insulating layer is located between the common electrode line and the detection pad.

11. The liquid crystal display device according to claim 9, wherein along a thickness direction of the liquid crystal display panel, the detection pad is located on a side of a target conductive member away from the color filter substrate, and the detection pad is in the same layer with the common electrode line, and the target conductive member is configured for indicating the conductive members located on the detection sub-region.

12. The liquid crystal display device according to claim 11, wherein a material of the detection pad is the same as a material of the common electrode line.

13. The liquid crystal display device according to claim 12, wherein a size of the color filter substrate is smaller than a size of the array substrate, and a part of the detection pad is located on an area where the color filter substrate and the array substrate are not overlapped, and the area being close to a circuit board.

14. The liquid crystal display device according to claim 13, wherein a shape of the detection sub-region is one selected from a group of a circle, a square, a triangle, and a polygon.

15. The liquid crystal display device according to claim 14, wherein the conductive sub-region and the detection sub-region are adjacent to each other and have complementary shapes.

16. The liquid crystal display device according to claim 15, wherein the conductive members are gold balls or silver balls.

17. A detection method for a liquid crystal display panel, comprising:

connecting a detection device to a detection pad in the liquid crystal display panel, wherein the liquid crystal display panel, comprising:

a color filter substrate provided with a common electrode layer thereon; and an array substrate arranged in cell alignment with the color filter substrate, and provided with a common electrode line thereon, wherein the array substrate comprises a display area and a peripheral area, the peripheral area comprising a plurality of connection areas; and a plurality of conductive members located on the connection areas and arranged between the color filter substrate and the array substrate;

wherein at least one connection area comprises a conductive sub-region and a detection sub-region, and the conductive members located on the conductive sub-region are respectively in contact with the common electrode line and the common electrode layer, and configured for conducting the common electrode line and the common electrode layer; and the conductive members located on the detection subregion are respectively in contact with the common electrode layer and the detection pad, and configured for conducting the common electrode layer and the detection pad; the detection pad is arranged on the array substrate and the detection pad is not in contact with the common electrode line; and determining whether a voltage is detected on the detection pad through the detection device;

wherein when the voltage is detected from the detection device, the common electrode layer on the color filter substrate and the common electrode line on the array substrate are in normal conduction; and when no voltage is detected from the detection device, the common electrode layer on the color filter substrate and the common electrode line on the array substrate are not conducted.

* * * * *